United States Patent [19]

Fajen

[11] 3,708,756

[45] Jan. 2, 1973

[54] BIASING NETWORK FOR TRANSISTORS

[75] Inventor: Lyle A. Fajen, Scottsdale, Ariz.

[73] Assignee: Motorola, Inc., Franklin Park, Ill.

[22] Filed: May 12, 1971

[21] Appl. No.: 142,699

[52] U.S. Cl. ........................................ 330/29, 330/40

[51] Int. Cl. ................................................ H03g 3/30

[58] Field of Search ............................ 330/22, 40, 29

[56] References Cited

UNITED STATES PATENTS 3,513,406 5/1970 Leuthauser ............................ 330/40

3,551,833 12/1970 Hilbert et al ....................... 330/40 X

*Primary Examiner*—Roy Lake

*Assistant Examiner*—James B. Mullins

*Attorney*—Mueller, Aichele & Gillman

[57] ABSTRACT

A biasing network for an RF transistor amplifier is provided wherein the bias varies smoothly and continuously from a value below turn on giving class B operation at low power inputs, to a lower valve giving class C operation at higher power levels, and finally, to a point where the DC dynamic impedance between the base and the emitter of the amplifier is extremely low, promoting maximum transistor gain and efficiency. Linear amplification at RF frequencies over the full range of power inputs is achieved.

9 Claims, 3 Drawing Figures

INVENTOR
Lyle A. Fajen
BY Mueller & Aichele
ATTY'S

INVENTOR
Lyle A. Fajen
BY
Mueller & Aichele
ATTY'S

BIASING NETWORK FOR TRANSISTORS

BACKGROUND OF THE INVENTION

This invention relates to biasing networks for linear radio frequency transistor power amplifiers and it is an object of the invention to provide improved networks of this character.

Linear dynamic power amplification over wide ranges of input power with high power transistors in the VHF and UHF frequency bands may be achieved with class A biasing. Such systems, however, have low efficiency because of the power consumed in the circuit. Operation of high power transistors in the VHF and UHF frequency bands with class B and class C biasing to obtain constant gain over the range of power desired are also known. However, such systems have relatively abrupt changes in bias from one class to another. Accordingly it is an object of the invention to overcome these shortcomings of the prior art.

It is a further object of the invention to provide an improved high power transistor amplifier operating in the VHF and UHF ranges and with class B and class C biasing which has high efficiency and linear gain over a wide dynamic range. That is, the advantages of the invention are achieved from low power inputs to high power inputs.

It is a further object of the invention to provide a biasing network of the nature indicated which provides protection against reverse base-emitter breakdown of the RF transistor at high power operation.

It is a still further object of the invention to provide a biasing network of the nature indicated which provides low base-to-emitter DC impedance for efficient peak signal amplification while providing proper bias for small signal amplification.

SUMMARY OF THE INVENTION

In carrying out the invention in one form there is provided a bias circuit for an RF transistor amplifier wherein such amplifier has an emitter, a base and a collector and operates in the class B and class C ranges comprising means for applying a positive voltage level bias below the turn-on value of such transistor to said base at zero RF power input to such transistor, and transistor means for varying said bias voltage level from said positive below turn-on voltage level at zero power RF power input to a negative voltage level at a relatively low percentage of RF power input and to a still lower negative voltage level at a higher percentage RF power inputs.

DESCRIPTION OF THE PREFERRED EMBODIMENT

Figure 1:
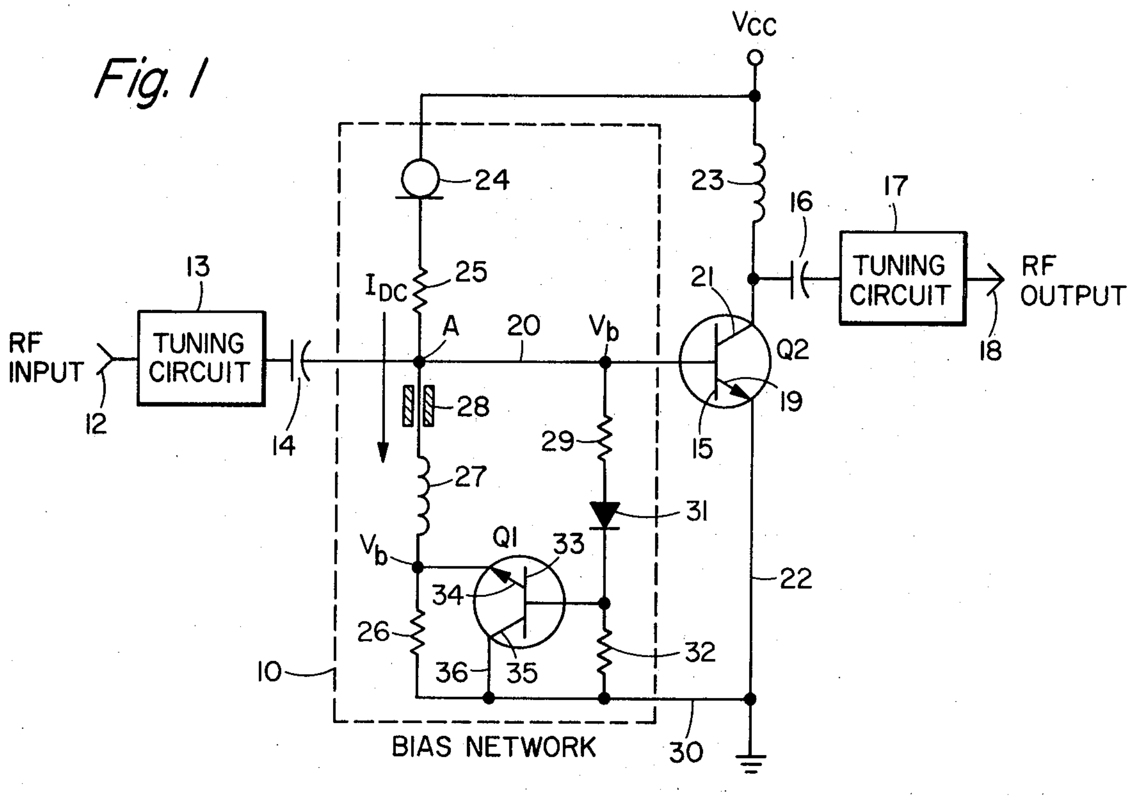
FIG. 1 is a circuit diagram of a biasing circuit according to the invention.

Referring to the drawings there is shown a bias network for an Rf amplifier Q2 in accordance with the invention.

In the complete circuit an RF input 12 may be supplied through a tuning circuit 13 and through a DC blocking capacitor 14 to the base 15 of RF transistor Q2. The output of the circuit may be taken through the DC blocking capacitor 16 and a tuning circuit 17 to the RF output 18.

The amplifier Q2 may be of any well know type RF transistor having a base 15, an emitter 19 and a collector 21. The emitter 19 is connected through conductor 22 to ground and the collector 15 may be connected through a radio frequency choke 23 to a source of DC voltage $V_{cc}$.

In actual applications according to the invention $V_{cc}$ may swing from as low as 2 volts DC to as high as 48 volts DC. The RF output 18, being taken through DC blocking capacitor 16, is connected to the collector 21 as shown. While the RF amplifier Q2 is shown as an NPN transistor it will be understood that a PNP transistor may be used. The RF choke 23 isolates the RF from the DC source $V_{cc}$.

The function of the biasing circuit 10 is to provide the transistor Q2 with a bias input at junction A (connected to base 15 by conductor 20) having the desired DC and RF impedance characteristics which will allow linear amplification of RF frequencies over a wide power range. Thus, the biasing circuit 10 has two portions, one functioning essentially only at low power levels and another portion together with said one portion functioning at increasing to high power levels with a smooth and continuous transition therebetween.

The low power level portion comprises a constant current diode 24, a resistor 25, the series combination of which is connected to junction A, a resistor 26, an RF inductor 27 and a ferrite bead 28 connected in series between point A and ground through conductor 30 as shown.

The increasing to high power level portion of the biasing circuit includes, in addition to the low power level portion, a transistor Q1 and a biasing series circuit therefore comprising a resistor 29, a diode 31 and a resistor 32.

The series circuit 29, 31 and 32 provides bias to the base 33 of transistor Q1 whose emitter 34 is connected to the terminal of resistor 26 connected to inductor 27 and thus to point A and whose collector 35 is connected to ground through conductor 36. Thus the emitter-collector circuit of transistor Q1 is a bypass around resistor 26 and the combination of these two components provides a variable impedance for giving the varying bias needed, as between low power inputs and high power inputs, at radio frequency, according to the invention.

Referring first to the low power portion of the bias network the diode 24 is a constant current device which may be of the type designated as 1N5314 manufactured by Motorola, Inc. The purpose of diode 24 is to provide a high impedance constant current $I_{DC}$ through the resistor 26. The circuit of this constant current is through the diode 24 connected to $V_{cc}$ as shown, through resistor 25, ferrite lead 28, RF inductor 27 and resistor 26, one of whose terminals is connected to ground as shown through conductor 30. Typically, the resistor 26 may have a value of about 100 ohms and the current supplied by the diode 24 provides a voltage of about 0.5 volts at the point A under DC or static conditions. The voltage at point A is, of course, the base voltage $V_b$ of the transistor Q1. The transistor Q1 having a turn on base voltage of about 0.6 volts, the DC bias value of 0.5 volts initially maintains the transistor Q1 in a nonconducting state and the amplifier is, in effect, operating in a class B mode.

The resistor 25 is a power dissipation limiting resistor and may have a value, typically, of about 1.8 K-ohms in order to provide a large impedance when $V_{cc}$ is low and to prevent the diode 24 from burning out at high levels of $V_{cc}$ which as indicated may swing from 2 volts DC to 48 volts DC in typical applications.

The RF inductor 27 may have a value of about 0.15 micro-henrys and, typically, is anti-resonant above the highest operating frequency of the amplifier. The ferrite bead 28 modifies the Q of the circuit to less than unity under all conditions of operation.

Referring now to the biasing circuit for Q2 at higher power levels, the diode 31 in conjunction with resistors 29 and 32 rectifies the RF supplied from the input and develops a DC bias for the transistor Q1 proportional to the RF input drive level. At low RF input levels transistor Q1 is biased off, as explained, thereby allowing the resistor 26 to develop the bias for RF amplifier 11 which is operating in a class "B" mode.

When the RF input is increased sufficiently, transistor Q1 begins to saturate, shunting resistor 26 and changing the operating mode of amplifier 11 from class "B" to class "C." At high drive level conditions the DC dynamic impedance between the base and the emitter of amplifier Q2 is very low promoting maximum transistor gain and efficiency. As the drive level is increased or decreased from an intermediate level, the dynamic impedance changes in a nonlinear manner, counteracting the normal transistor nonlinearity.

Figure 2:
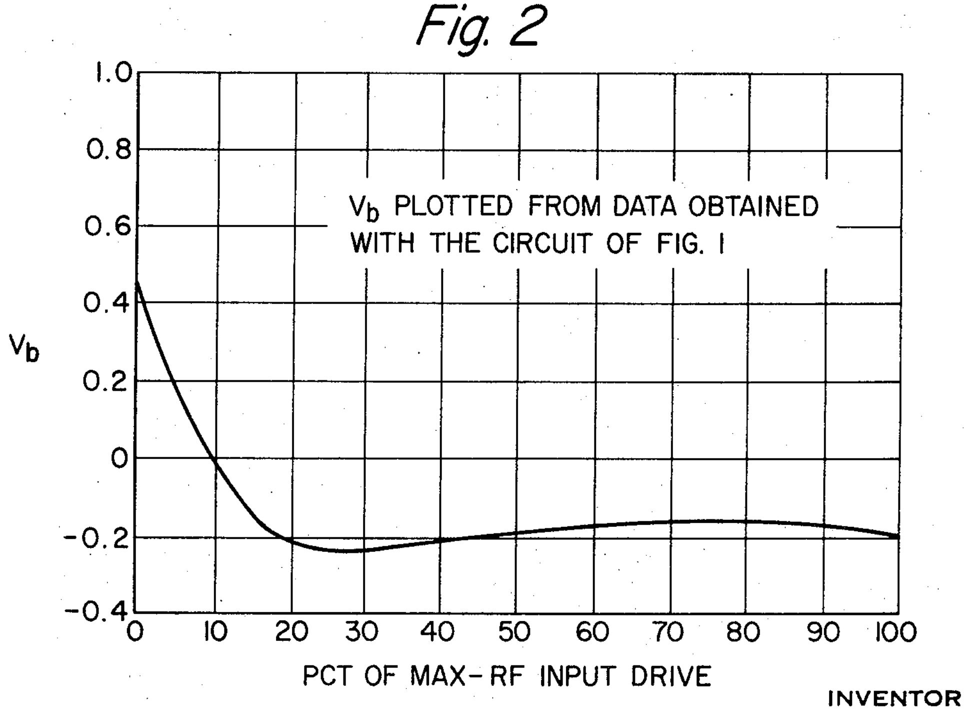
FIG. 2 is a graph showing the variation of DC bias voltage with RF input power for the circuit according to the invention and FIG. 3 is a graph showing the variations of RF impedance and DC impedance at the input to the base of the power transistor.
Figure 3:
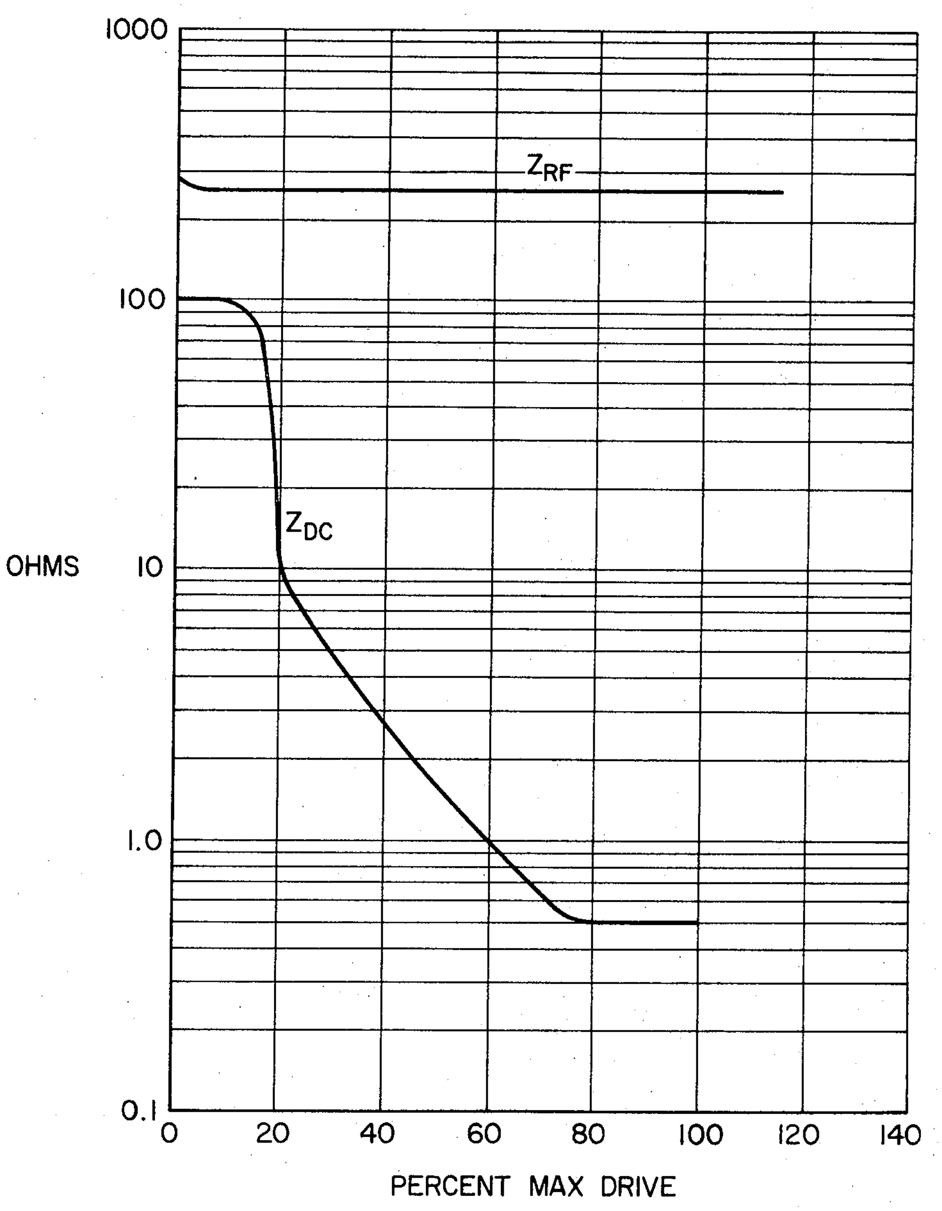

The operation of the network can be explained by noting the DC voltage characteristic ($V_b$) shown in FIG. 2 and the DC and RF impedance profile ($Z_{DC}$, $Z_{RF}$) present at junction A, shown in FIG. 3 as a percent of maximum which is the typical type of RF drive application when using this network.

$V_b$, shown in FIG. 2 is normally set at 0.5 volts DC at room temperature by the selection of $I_{DC}$ the current flowing through the diode 24 and R2. As the RF drive level is increased the base of the transistor Q1 begins to conduct unilaterally in a direction opposite to the initial $I_{DC}$. This decreases $V_b$ as is shown in FIG. 2. Increased RF drive level also causes diode 31 to conduct, biasing transistor Q1 on. The dynamic collector to emitter impedance of transistor Q1 during the increase of drive level decreases to a low value thereby shunting resistor 26. This characteristic is shown in FIG. 2. $Z_{RF}$, however, remains relatively constant because of the RF inductor 27 and the ferrite bead 28. Thus referring to FIG. 2 at zero percent of input drive the bias $V_b$ is about 0.5 volts positive. This decreases as the amplifier Q2 begins to conduct until a negative bias of about −0.2 volts is reached at 100 percent of input drive.

Referring to FIG. 3 it will be observed that the curve $Z_{DC}$ which is the DC impedance of the bias circuit, diminishes rapidly to about 10 ohms at about 20 percent of maximum drive level, diminishes more slowly to a value of about 0.5 of an ohm at about 80 percent of maximum drive and continues at the value of 0.5 ohm from 80 percent to 100 percent of RF input drive. In other words the combination of resistance 26 and the variable impedance of transistor Q1 as determined by the biasing circuit connected to its base 33 has a variable DC impedance as shown by the curve $Z_{DC}$. The radio frequency impedance $Z_{RF}$ is essentially constant from very low values of RF input drive to the input drive value of 100 percent. In other words the parallel combination of resistance 26 and the impedance of the transistor 28 decreases to an ultimate constant value.

Thus while the DC impedance $Z_{DC}$ is changed the RF impedance $Z_{RF}$ is relatively constant because of the RF inductor 27 and the ferrite bead 28.

The diode 24 may have a temperature characteristic which is complementary to the static turn-on point of transistor Q2. Thus the biasing circuit is temperature compensating. Further compensation may be effected by selecting resistor 26 with a desired temperature coefficient.

The transistor Q1 also prevents reverse base-emitter breakdown ($V_{BER}$) of the amplifier Q2 because its saturated $V_{CE}$ is always less than $V_{BER}$ of Q2.

The combined value of $I_{DC}$ and resistance 26 is selected during the design of the amplifier stage to obtain maximum stage linearity at low input levels. The resistors 29 and 32 affect linearity and peak power amplifying capability of Q2 and are also selected during the amplifier design.

The resistor 29 typically may have a value of 560 ohms and the resistor 32 typically may have a value of about 330 ohms. Diode 31 may be a hot carrier diode of the type designated as IN5711, the amplifer Q2 may be of the type JO–2001 and the transistor Q1 may be of the type 2N2222 as designated by the respective manufacturers thereof.

The various constants given as well as the specific devices are exemplary only and were part of one actual circuit. Other devices and other constants may be used to suit particular circumstances as desired.

The overall action of the biasing network therefore:

1. Provides pre-bias of the transistor Q2 to temperature compensated class "B" operation at low drive level.
2. Provides low DC impedance and allows class "C" operation at high drive levels.
3. Provides smooth transition between class "B" and class "C" operation at intermediate drive levels, counteracting normal transistor non-linearity, thereby resulting in a linearized RF input-RF output characteristic.
4. Provides inherently low Q and provides an essentially resistive high impedance RF shunt to the base turning circuit and to the base of the transistor Q2, thereby allowing ease of incorporation into existing amplifier designs.
5. Provides the correct DC voltage and impedance to operate very high power radio frequency power transistors in a linear mode.

What is claimed is:

1. A bias circuit for an RF transistor amplifier wherein such amplifier has an emitter, a base and a collector and operates in the class B and class C ranges comprising means for applying a positive voltage level bias below the turn-on value of such transistor to said base at zero RF power input to such transistor, and transistor means for varying said bias voltage level from said positive below turn-on voltage level at zero power RF power input to a negative voltage level at a relatively low percentage of RF power input and to a still lower negative voltage level at a higher percentage RF power input, said transistor means having an emitter, a base and a collector, and said transistor means being controlled in response to the voltage on its base in accordance with the RF power input to the base of said amplifier.

2. A bias circuit according to claim 1 wherein the base voltage of said transistor means is supplied by a circuit comprising an RF diode.

3. A bias circuit according to claim 2 wherein said RF diode is a hot carrier diode.

4. A bias circuit according to claim 2 wherein the base voltage circuit includes a resistor divider network.

5. A bias circuit for an RF transistor amplifier wherein such amplifier has an emitter, a base and a collector and operates in the class B and class C ranges comprising circuit means for applying a positive voltage level bias below the turn-on value of such transistor to said base at zero RF power input to such transistor, said circuit means including a resistor connected from the base of said transistor to the emitter thereof and a constant current diode connected from said base to a source of DC voltage, and transistor means connected across said resistor for varying said bias voltage level from said positive below turn-on voltage level at zero power RF power input to a negative voltage level at a relatively low percentage RF power input and to a still lower negative voltage level at higher percentage RF power inputs.

6. A bias circuit according to claim 5 wherein said circuit means further includes a voltage limiting resistor for said constant current diode.

7. A bias circuit according to claim 6 wherein said circuit means further includes an RF inductor and a Q lowering ferrite member.

8. A bias circuit according to claim 5 wherein the transistor means includes an emitter connected to said resistor at the terminal thereof connected to the base of said transistor amplifier, a collector connected to the emitter of said transistor amplifier and a base connected to a control circuit.

9. A bias circuit according to claim 8 wherein the control circuit comprises a resistor connected across the base and collector of the transistor means, an RF diode and a resistor connected to the base of said transistor means and the base of amplifier transistor.

* * * * *